United States Patent
Janzen

(10) Patent No.: US 8,677,170 B2
(45) Date of Patent: *Mar. 18, 2014

(54) METHOD FOR GENERATING A CLOCK SIGNAL

(75) Inventor: Leel S. Janzen, Meridian, ID (US)

(73) Assignee: Round Rock Research, LLC, Jersey City, NJ (US)

( * ) Notice: Subject to any disclaimer, the term of this patent is extended or adjusted under 35 U.S.C. 154(b) by 44 days.

This patent is subject to a terminal disclaimer.

(21) Appl. No.: 13/404,775

(22) Filed: Feb. 24, 2012

(65) Prior Publication Data

US 2012/0159229 A1  Jun. 21, 2012

Related U.S. Application Data

(60) Continuation of application No. 12/568,532, filed on Sep. 28, 2009, now Pat. No. 8,127,171, which is a continuation of application No. 11/493,427, filed on Jul. 25, 2006, now Pat. No. 7,610,503, which is a division of application No. 11/331,300, filed on Jan. 11, 2006, now Pat. No. 7,275,172, which is a division of application No. 10/713,587, filed on Nov. 13, 2003, now Pat. No. 7,065,666.

(51) Int. Cl.
  *G06F 1/12* (2006.01)
(52) U.S. Cl.
  USPC ............ 713/401; 713/400; 713/500; 713/503
(58) Field of Classification Search
  USPC .................................. 713/400, 401, 500, 501
  See application file for complete search history.

(56) References Cited

U.S. PATENT DOCUMENTS

| | | | |
|---|---|---|---|
| 5,465,076 A * | 11/1995 | Yamauchi et al. | ............ 331/179 |
| 5,560,000 A | 9/1996 | Vogley | |
| 5,751,655 A | 5/1998 | Yamazaki et al. | |
| 5,754,838 A | 5/1998 | Shibata et al. | |
| 5,771,264 A | 6/1998 | Lane | |
| 5,835,956 A | 11/1998 | Park et al. | |
| 5,886,918 A | 3/1999 | Nakamura | |
| 6,011,732 A | 1/2000 | Harrison et al. | |
| 6,020,773 A | 2/2000 | Kan et al. | |
| 6,026,050 A | 2/2000 | Baker et al. | |
| 6,061,296 A | 5/2000 | Ternullo, Jr. et al. | |
| 6,151,270 A | 11/2000 | Jeong | |
| 6,262,938 B1 | 7/2001 | Lee et al. | |
| 6,359,579 B1 | 3/2002 | Chiang | |
| 6,415,339 B1 | 7/2002 | Farmwald et al. | |
| 6,426,900 B1 | 7/2002 | Maruyama et al. | |
| 6,438,067 B2 | 8/2002 | Kuge et al. | |

(Continued)

*Primary Examiner* — Kim Huynh
*Assistant Examiner* — Zahid Choudhury
(74) *Attorney, Agent, or Firm* — Lerner, David, Littenberg, Krumholz & Mentlik, LLP

(57) ABSTRACT

An apparatus for generating a delayed clock signal. The apparatus is a computer system with a processor to which a memory device is coupled. The memory device has a delay clock generator that has a synchronizing circuit for generating an output clock signal from an input clock signal and further includes a delay circuit having an input coupled to the output of the synchronizing circuit. The delay circuit provides an output clock signal having a delay with respect to the clock signal from the synchronizing circuit according to one of a plurality of programmable time delays selected in accordance with a selection signal. The method of generating a clock signal includes synchronizing an internal clock signal to an external clock signal, and delaying the internal clock signal different amounts based on a selection value indicative of external clock frequency to provide the clock signal.

19 Claims, 6 Drawing Sheets

(56) References Cited

U.S. PATENT DOCUMENTS

| | | |
|---|---|---|
| 6,493,829 B1 | 12/2002 | Kubo |
| 6,529,423 B1 | 3/2003 | Yoon et al. |
| 6,542,416 B1 | 4/2003 | Hampel et al. |
| 6,552,955 B1 | 4/2003 | Miki |
| 6,553,472 B2 | 4/2003 | Yang et al. |
| 6,570,800 B2 | 5/2003 | Tanaka et al. |
| 6,621,315 B2 | 9/2003 | Heo et al. |
| 6,625,242 B1 | 9/2003 | Yoo et al. |
| 6,636,978 B1 * | 10/2003 | Kirihata et al. ............... 713/400 |
| 6,920,080 B2 | 7/2005 | Chung et al. |
| 6,958,658 B2 | 10/2005 | Shah et al. |
| 7,035,366 B2 | 4/2006 | Tokutome et al. |
| 7,068,084 B2 | 6/2006 | Byun et al. |
| 7,134,034 B1 | 11/2006 | Shamarao |
| 7,137,022 B2 | 11/2006 | Ishikawa |
| 2003/0218921 A1 | 11/2003 | Schrogmeier et al. |
| 2004/0260961 A1 | 12/2004 | Zhao et al. |

* cited by examiner

METHOD FOR GENERATING A CLOCK SIGNAL

CROSS-REFERENCE TO RELATED APPLICATIONS

This application is a continuation of U.S. patent application Ser. No. 12/568,532 which was filed on Sep. 28, 2009, which is scheduled to issue as U.S. Pat. No. 8,127,171 on Feb. 28, 2012, which is a continuation of U.S. patent application Ser. No. 11/493,427, which was filed on Jul. 25, 2006, which issued as U.S. Pat. No. 7,610,503 on Oct. 27, 2009, which is a divisional of U.S. patent application Ser. No. 11/331,300, which was filed on Jan. 11, 2006, which issued as U.S. Pat. No. 7,275,172 on Sep. 25, 2007, which is a divisional of U.S. patent application Ser. No. 10/713,587, which was filed on Nov. 13, 2003, which issued as U.S. Pat. No. 7,065,666 on Jun. 20, 2006. All of which are hereby incorporated herein by reference.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, data are placed on a data bus by the memory device in synchronism with the external clock signal, and consequently, the memory device must provide the data to the bus at the proper times. To provide the data at the correct times, an internal clock signal is developed in response to the external clock signal, and is typically applied to latches contained in the memory device to thereby clock the data onto the data bus. The internal clock signal and external clock must be synchronized to ensure the internal clock signal clocks the latches at the proper times to successfully output the data at the proper times.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. Additionally, in the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

FIG. 1 is a simplified block diagram of output circuitry 100 for a conventional synchronous memory device, as well known in the art. The output circuitry 100 includes an output driver 102 that receives internal data signals DATA that represent binary data, and further receives a bi-directional data strobe signal DQS that is generated by a DQS generator 104. The DQS is eventually transmitted externally, along with data signals DQ, for use in the capture at a receiving device. The output circuitry 100 is coupled to a DLL 106 and trimmable delay 108 to receive a clock signal CLKDEL, and has an output coupled to an external data terminal of the memory device (not shown) in order to provide the data to a data bus. The DLL 106 generates a clock signal CLKDLL synchronized with an external clock signal CLK, which is applied to the DLL 106. The CLKDLL signal is then input to the trimmable delay 108 to generate the CLKDEL signal, which is a clock signal having a time delay tTRIM relative to the CLKDLL signal. In operation, the output driver 102 outputs the DQ and DQS signals in response a transition of the CLKDEL signal.

The trimmable delay 108 is included in the output circuitry 100 to take advantage of device performance exceeding the published timing specifications for the device, typically in order to increase internal timing margins. In conventional SDRAM devices, the time from when a read command is first latched by the memory device to when data is latched by the output driver 102 and ready to be output in response to the CLKDEL signal, is generally a fixed time that is inherent to the memory device. The time is typically referenced as tAA. Another timing characteristic inherent to a memory device, which will be referenced herein as tOUT, is the time from when a transition of the CLKDEL signal is detected by the output driver 102 and when the DQ and DQS are made available at the external terminal for reading. A common timing specification related to tOUT is tAC, which is defined as the access window of the DQ relative to a transition of the external CLK signal. That is, valid DQ is guaranteed to be present at the external data terminal no later than tAC after a transition of the CLK signal. As generally known in the art, the actual performance of the memory device, as measured by tOUT, exceeds the published performance, which is guaranteed to be no longer than tAC.

As previously mentioned, where the performance of the memory device exceeds the published timing specifications of the memory device, internal timing margins for the memory device can be improved. One approach is to use internal delays, such as the trimmable delay 108, to increase timing margins for related internal timing parameters. In the specific case of data output circuitry, such as the output circuitry 100, the excess performance of the memory device provided by tOUT over the published performance specification of tAC is often taken advantage of to increase the timing margin for tAA. The trimmable delay 108 is trimmed to set the time delay tTRIM for the CLKDEL signal relative to the CLKDLL signal. With more time delay tTRIM, the margin for tAA is increased. That is, the time for data to be provided to the output driver 102 after a read command is registered is increased. For example, with respect to FIG. 2, tTRIM is shown at the maximum time delay which the trimmable delay 108 can have and still meet the published tAC specification. The time tAA MARGIN represents additional time the DATA signal can take to be valid at the input of the output driver 102. Thus, the time for data to be provided to the output driver 102 following the receipt of a read command is increased, providing a greater range of tAAs that will yield memory devices which meet the published tAC performance specifications. The trimmed memory devices are then sorted for "speed-grades" based on the actual performance resulting from the trimming of the trimmable delay 108, as well known.

Although DLLs are assumed to be stable and frequency independent, in many designs the DLL has a delay component that varies with the frequency of the input clock signal. For example, the delay of a DLL may be proportionate with clock frequency, resulting in an output clock signal, which ideally is synchronized with the input clock signal, that increasingly lags the input clock signal as the frequency of the input clock signal increases. In applications in memory devices that can operate at different clock frequencies, which many conventional memory devices can do, the varying delay introduced by a non-ideal DLL will affect the timing of internal circuitry that relies on the clock signal generated by the DLL. With respect to the output circuitry 100, the varying delay of the DLL 106 will ultimately affect the timing of when the DQ and DQS signals will be output by the data driver 102. For memory devices operating at higher frequencies, unless the skew added by the DLL 106 is accommodated, the memory device may fail to meet published timing specifications.

Further complicating the timing restrictions of a memory device is that memory devices that can operate at different clock frequencies have CAS (read) latency restrictions for operations at the various external clock frequencies, as well known. CAS latency is typically defined as the delay, in number of clock cycles, between the registration of a read command and the availability of the first bit of output data. Generally, CAS latency is a lower value for lower external clock frequencies (e.g., a CAS latency value of 2 for an external clock frequency of 133 MHz) and a higher value for higher external clock frequencies (e.g., a CAS latency value of 3 for an external clock frequency of 200 MHz). In this manner, the total time which a memory device has to complete a read operation can be maintained, to some extent, for operation at the different clock frequencies.

Typically, the varying delay introduced by the DLL 106 is accommodated by setting the delay of the trimmable delay 108 based on a "worst-case" timing scenario that still meets published timing specifications. That is, assuming that the DLL 106 introduces a delay that varies as described above, the delay of the trimmable delay 108 is set assuming the memory device is operated at the highest published clock frequency and having the shortest tAC specification. More specifically, in order for the memory device to still meet the shortest published tAC when operated at the highest published clock frequency, the delay of the trimmable delay 108 must be reduced to compensate for the increasing delay of the non-ideal DLL 106. However, as a result of reducing the delay time of the trimmable delay 108, the overall timing margin for tAA is decreased. Where the memory device is operated at a lower maximum operating clock frequency, such as for memory devices categorized in slower speed-grades, the margin is further decreased because the time delay introduced by the DLL 106 is less for lower external clock frequencies. As previously discussed, having greater tAA margin can have a positive affect on the yield of memory devices that meet published timing parameters. By decreasing the delay of the trimmable delay 108, memory devices that would have otherwise been acceptable under a more relaxed tAA requirement may now no longer meet the published timing specifications because of the shorter delay of the trimmable delay 108. Consequently, the yield of acceptable memory devices can be negatively affected by setting the trimmable delay 108 to a shorter delay time.

The relationship between the previously discussed internal timing for the various signals is illustrated in FIGS. 2B and 2C. In FIG. 2B, at a time T0, the CLK signal has a positive signal transition from LOW to HIGH. At a time T1, a time delay tDLL 1 after the time T0, the CLKDLL signal makes a positive transition in response to the CLK signal. The time delay tDLL 1 represents the time delay of the non-ideal DLL 106 at the highest published operating frequency, which represents the worst-case timing scenario. At a time T2, the CLKDEL signal has a positive transition due to the set time delay tTRIM, which is set to the delay of the DLL 106 assuming the highest external clock frequency. In response to the transition of the CLKDEL signal at the time T2, the output driver 102 begins to output the DQ and DQS signals. However, as shown in FIG. 2B, a valid DATA signal is not provided to the output driver until a time T3, which is after the output driver 102 begins to output the DQ and DQS signals. Consequently, the information of the DQ signal output by the output driver 102 at a time T4 is unknown, and is considered invalid.

Categorizing the same memory device at a slower speed-grade (i.e., having a lower maximum operating frequency and relaxed tAC) also does not result in a memory device meeting the published specifications, as illustrated by FIG. 2C. At a time T0, the CLK signal has a positive signal transition. In response, the CLKDLL signal has a positive transition a time delay tDLL 2 later at a time T1. The time delay tDLL 2 is less than the time delay tDLL 1 shown in FIG. 2B because of the non-ideal characteristic of the DLL 106. More specifically, the time delay tDLL 2 is less than the time delay tDLL 1 because of the lower maximum operating clock frequency for the memory device having a slower speed-grade. At a time T2, a time delay tTRIM after the time T1, the CLKDEL signal has a transition, which causes the output driver 102 to begin outputting the DQ and DQS signal. The time delay tTRIM is the same as for FIG. 2B because, as previously mentioned, the time delay tTRIM is set based on the worst-case timing scenario, regardless of the speed-grade of the memory device. At the time T2, valid DATA is still not present at the input of the output driver 102, and consequently, the DQ and DQS signals output by the output driver 102 at a time T3 are unknown, and considered invalid. It is not until at a time T4, valid DATA reaches the input of the output driver 102.

As illustrated by the timing diagrams of FIGS. 2A and 2B, in some cases, the tAA margin may actually be reduced at a lower clock frequency for a memory device categorized in a slower speed-grade, although the tAC specification is more relaxed. Accommodating the two competing timing parameters, that is, having acceptable tAA margin versus meeting published tAC specifications for the highest clock frequency conditions, results in a compromise that attempts to minimize any negative affect to memory device yield. However, as well known, it is desirable to increase the yield of acceptable memory devices in order to reduce the manufacturing costs per memory device. Therefore, there is a need for an alternative approach to dealing with the tension between the inversely related timing parameters, and which can consequently have a positive effect on memory device yield.

BRIEF SUMMARY OF THE INVENTION

According to one aspect of the present invention, a clock signal generator is provided. The clock signal generator includes a synchronizing circuit having an input terminal at which an input clock signal is applied and an output terminal at which a first delayed clock signal is provided. The clock signal generator further includes a delay circuit having an input coupled to the output of the synchronizing circuit, an output at which an output clock signal is provided, and a selection terminal for receiving a selection signal. The delay circuit provides an output clock signal having a delay with respect to the first delayed clock signal according to one of a plurality of programmable time delays selected in accordance with the selection signal. In another aspect of the invention a method of generating a clock signal is provided which includes synchronizing an internal clock signal to an external clock signal, and delaying the internal clock signal different amounts based on a selection value indicative of external clock frequency to provide the clock signal.

DETAILED DESCRIPTION

Figure 3:
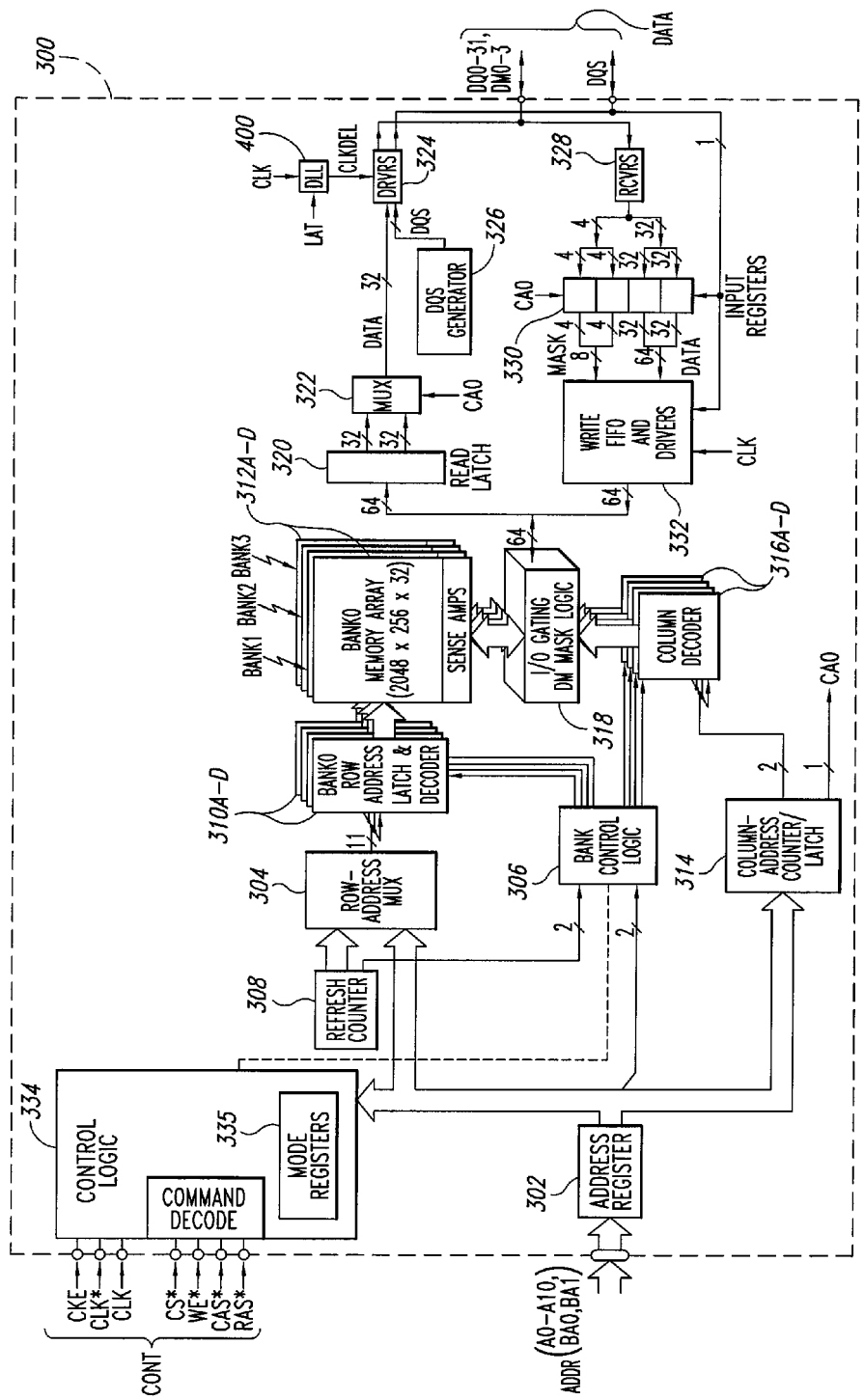
FIG. 3 is a simplified functional block diagram of a synchronous memory in which embodiments of the present invention can be implemented.

FIG. 3 is a functional block diagram of a memory device 300 in which embodiments of the present invention can be implemented. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention. The memory device 300 in FIG. 3 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 300 includes a control logic and command decoder 334 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*"designating a signal as being active low. The command signals CS*, WE*, CAS*, and RAS* are driven to values corresponding to a particular command, such as a read, write, or auto-refresh command. In response to the clock signals CLK, CLK*, the command decoder 334 latches and decodes an applied command, and generates a sequence of clocking and control signals that control the components 302-332 to execute the function of the applied command. The clock enable signal CKE enables clocking of the command decoder 334 by the clock signals CLK, CLK*. The command decoder 334 latches command and address signals at positive edges of the CLK, CLK* signals (i.e., the crossing point of CLK going high and CLK* going low), while the input registers 330 and data drivers 324 transfer data into and from, respectively, the memory device 300 in response to both edges of the data strobe signal DQS and thus at double the frequency of the clock signals CLK, CLK*. This is true because the DQS signal has the same frequency as the CLK, CLK* signals. The memory device 300 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 334 in generating the control and timing signals is conventional, and thus, for the sake of brevity, will not be described in more detail.

Also included in the control logic 334 are mode registers 335. The mode registers 335 are programmed with values that define the mode of operation of the memory device 300. For example, the different modes of operation include the selection of a burst length, burst type, and an operating mode, as well known. A CAS latency value is also programmed in the mode registers 335. As previously discussed, the CAS latency is the delay, in clock cycles, between the registration of a read command and the availability of the first bit of output data. The CAS latency is generally related to the operating clock frequency in that a recommended CAS latency value is defined for the various operating clock frequencies of the memory device. As will be explained in more detail below, in one embodiment of the present invention the CAS latency value programmed in the mode registers 335 is used for selecting one of a plurality of different time delays to use in timing the output of data onto a data bus. In this manner, internal timing margins can be adjusted based on the clock frequency of operation, as indicated by the CAS latency value.

Further included in the memory device 300 is an address register 302 that receives row, column, and bank addresses over an address bus ADDR, with a memory controller (not shown) typically supplying the addresses. The address register 302 receives a row address and a bank address that are applied to a row address multiplexer 304 and bank control logic circuit 306, respectively. The row address multiplexer 304 applies either the row address received from the address register 302 or a refresh row address from a refresh counter 308 to a plurality of row address latch and decoders 310 A-D. The bank control logic 306 activates the row address latch and decoder 310 A-D corresponding to either the bank address received from the address register 302 or a refresh bank address from the refresh counter 308, and the activated row address latch and decoder latches and decodes the received row address. In response to the decoded row address, the activated row address latch and decoder 310 A-D applies various signals to a corresponding memory bank 312 A-D to thereby activate a row of memory cells corresponding to the decoded row address. Each memory bank 312 A-D includes a memory-cell array having a plurality of memory cells arranged in rows and columns, and the data stored in the memory cells in the activated row is stored in sense amplifiers in the corresponding memory bank. The row address multiplexer 304 applies the refresh row address from the refresh counter 308 to the decoders 310 A-D and the bank control logic circuit 306 uses the refresh bank address from the refresh counter when the memory device 300 operates in an auto-refresh or self-refresh mode of operation in response to an auto-refresh or self-refresh command being applied to the memory device 300, as will be appreciated by those skilled in the art.

A column address is applied on the ADDR bus after the row and bank addresses, and the address register 302 applies the column address to a column address counter and latch 314 which, in turn, latches the column address and applies the latched column address to a plurality of column decoders 316 A-D. The bank control logic 306 activates the column decoder 316 A-D corresponding to the received bank address, and the activated column decoder decodes the applied column address. Depending on the operating mode of the memory device 300, the column address counter and latch 314 either directly applies the latched column address to the decoders 316 A-D, or applies a sequence of column addresses to the decoders starting at the column address provided by the address register 302. In response to the column address from the counter and latch 314, the activated column decoder 316 A-D applies decode and control signals to an I/O gating and data masking circuit 318 which, in turn, accesses memory cells corresponding to the decoded column address in the activated row of memory cells in the memory bank 312 A-D being accessed.

During data read operations, data being read from the addressed memory cells is coupled through the I/O gating and data masking circuit 318 to a read latch 320. The I/O gating and data masking circuit 318 supplies N bits of data to the read latch 320, which then applies two N/2 bit words to a multiplexer 322. In the embodiment of FIG. 3, the circuit 318 provides 64 bits to the read latch 320 which, in turn, provides two 32 bits words to the multiplexer 322. A data driver 324 sequentially receives the N/2 bit words from the multiplexer 322 and also receives a data strobe signal DQS from a strobe signal generator 326 and a delayed clock signal CLKDEL from a delay clock generator 400 according to an embodiment of the present invention. The DQS signal is used by an external circuit such as a memory controller (not shown) in latching data from the memory device 300 during read operations. In response to the delayed clock signal CLKDEL, the data driver 324 sequentially outputs the received N/2 bits words as a corresponding data word DQ, each data word being output in synchronism with a rising or falling edge of a CLK signal that is applied to clock the memory device 300. The data driver 324 also outputs the data strobe signal DQS having rising and falling edges in synchronism with rising and falling edges of the CLK signal, respectively. Each data word DQ and the data strobe signal DQS collectively define a data bus. As will be appreciated by those skilled in the art, the CLKDEL signal from the delay clock generator 400 is a delayed version of the CLK signal, and the delay clock generator 400 adjusts the delay of the CLKDEL signal relative to the CLK signal to ensure that the DQS signal and the DQ words are placed on the data bus to meet published timing specifications for the memory device 300. In the memory device 300, the time delay by which the CLKDEL signal is adjusted by the delay clock generator 400 is based on a LAT value, which is representative of the CAS latency value programmed in the mode registers 335. The data bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus. A data receiver 328 receives each DQ word and the associated DM0-X signals, and applies these signals to input registers 330 that are clocked by the DQS signal. In response to a rising edge of the DQS signal, the input registers 330 latch a first N/2 bit DQ word and the associated DM0-X signals, and in response to a falling edge of the DQS signal the input registers latch the second N/2 bit DQ word and associated DM0-X signals. The input register 330 provides the two latched N/2 bit DQ words as an N-bit word to a write FIFO and driver 332, which clocks the applied DQ word and DM0-X signals into the write FIFO and driver in response to the DQS signal. The DQ word is clocked out of the write FIFO and driver 332 in response to the CLK signal, and is applied to the I/O gating and masking circuit 318. The I/O gating and masking circuit 318 transfers the DQ word to the addressed memory cells in the accessed bank 312 A-D subject to the DM0-X signals, which may be used to selectively mask bits or groups of bits in the DQ words (i.e., in the write data) being written to the addressed memory cells.

Figure 4:
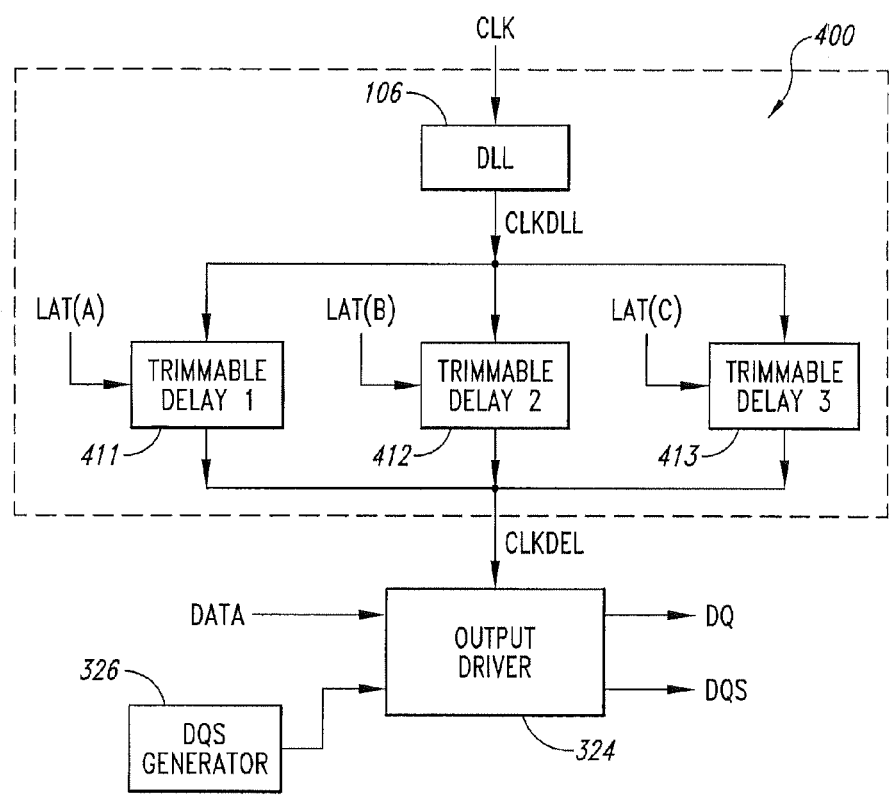
FIG. 4 is a simplified functional block diagram of a delay clock generator according to an embodiment of the present invention.

FIG. 4 illustrates a delay clock generator 400 according to an embodiment of the present invention. The delay clock generator 400 is coupled to an output driver 324 that receives data signals representative of binary data DATA and further receives a data strobe signal DQS from a DQS generator 326. The output driver 324 and DQS generator 326 are similar in design and operation as previously described with respect to the conventional output circuitry 100 of FIG. 1, and description thereof will not be repeated in the interest of brevity. The delay clock generator 400 includes a delay-locked loop (DLL) 106 that provides a clock signal CLKDLL, which is ideally synchronized with respect to the external clock signal CLK, to a plurality of trimmable delays 411, 412, 413. The DLL 106 is conventional in design and operation, as previously described with respect to the output driver circuitry (FIG. 1), and is non-ideal in that the DLL 106 includes a delay component that increases as the frequency of the CLK signal increases.

The trimmable delays 411, 412, 413 can be trimmed to set respective time delays tTRIM 1, tTRIM 2, tTRIM 3. When activated, the trimmable delays 411, 412, 413 provide an output clock signal having a respective delay relative to the CLKDLL signal. The resulting clock signal can be used as the delayed clock signal CLKDEL for triggering the output driver 102 to output data signals DQ and DQS signals. Selection of which one of the trimmable delays 411, 412, 413 to activate is through the use of the CAS latency value LAT(A), LAT(B), LAT(C) programmed in the mode register 335 of the control logic 334 (FIG. 3). The delay clock generator 400 receives a LAT signal that is indicative of the CAS latency value programmed in the mode register 335, and as shown in FIG. 4, the trimmable delay 411 is activated when the LAT signal has a LAT(A) value, the trimmable delay 412 is activated when the LAT signal has a LAT(B) value, and the trimmable delay 413 is activated when the LAT signal has a LAT(C) value.

The delay clock generator 400 provides the flexibility to tailor a time delay for the CLKDEL signal to accommodate different external clock frequencies at which a memory device in which the delay clock generator 400 is located can be operated. As previously discussed, the external clock frequency at which a memory device is operated is typically related to the CAS latency value that is programmed in the mode register 335. By selecting which trimmable delay 411, 412, 413 to activate based on the CAS latency value, a different time delay can be added to the CLKDLL signal for different external clock frequencies. In one embodiment, the time delays are trimmed such that for lower CAS latency values (i.e., lower external clock frequencies), longer time delays are provided. As will be explained in more detail below, providing different time delays can increase the yield of memory devices categorized for slower speed-grades, which are limited to lower maximum external clock frequencies and have relaxed tAC timing. Since the amount of delay between the CLKDLL signal and the CLKDEL signal is not limited to the "worst-case" scenario, which assumes the highest possible external clock frequency and the shortest tAC, the relaxed timing resulting from the lower maximum external clock frequency can be advantageously used to improve the internal timing margin of the memory device. As a result, those memory devices that marginally fail the published timing specifications under the trimmed delay for the worst-case timing situation may be able to meet the published timing specifications under more relaxed internal timing, as provided by using a different time delay between the CLKDEL signal with respect to the CLK signal for the lower maximum operating clock frequency.

Figure 1:
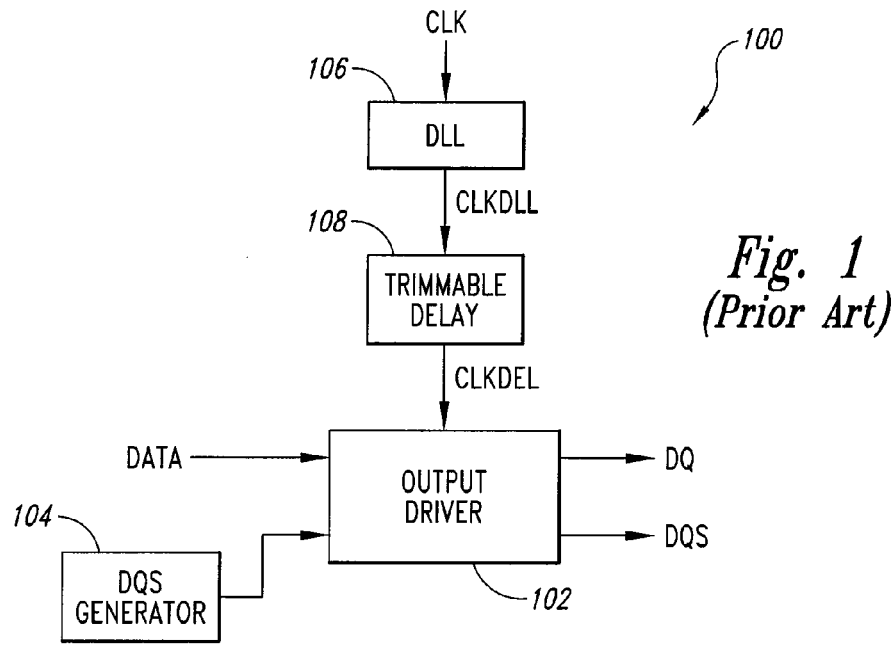
FIG. 1 is a simplified functional block diagram of output circuitry of a conventional memory device.

The delay clock generator 400 operates in much the same manner as the DLL 106, and the trimmable delay 108 previously described with respect to the output circuitry 100 of FIG. 1. However, the delay clock generator 400 can provide a CLKDEL signal having different delay relationships with respect to the CLKDLL signal based on the programmed CAS latency value, rather than being limited to one time delay regardless of the CAS latency. Each of the trimmable delays 411, 412, 413 is preferably trimmed to have a different time delay. Consequently, the timing of the CLKDEL signal with respect to the CLKDLL signal can be different for different CAS latencies. When the memory device 400 is operating, the appropriate trimmable delay 411, 412, 413 is activated according to the CAS latency value programmed in the mode register 335, and provides a CLKDEL signal having a time delay with respect to the CLKDLL signal of the activated trimmable delay. The remaining trimmable delays remain inactive and do not output any clock signal.

Figure 2A:
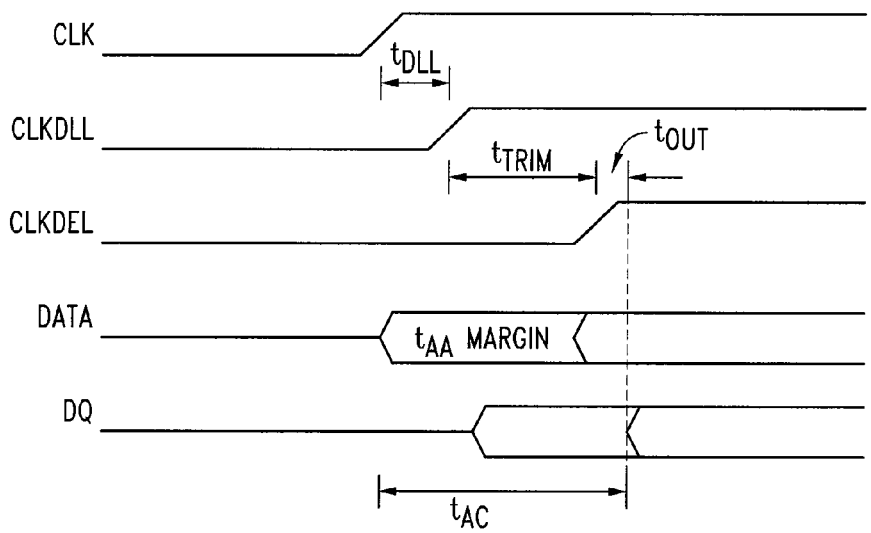
FIGS. 2A-2C are signal timing diagrams illustrating various signals generated during operation of the conventional output circuitry of FIG. 1.
Figure 2B:
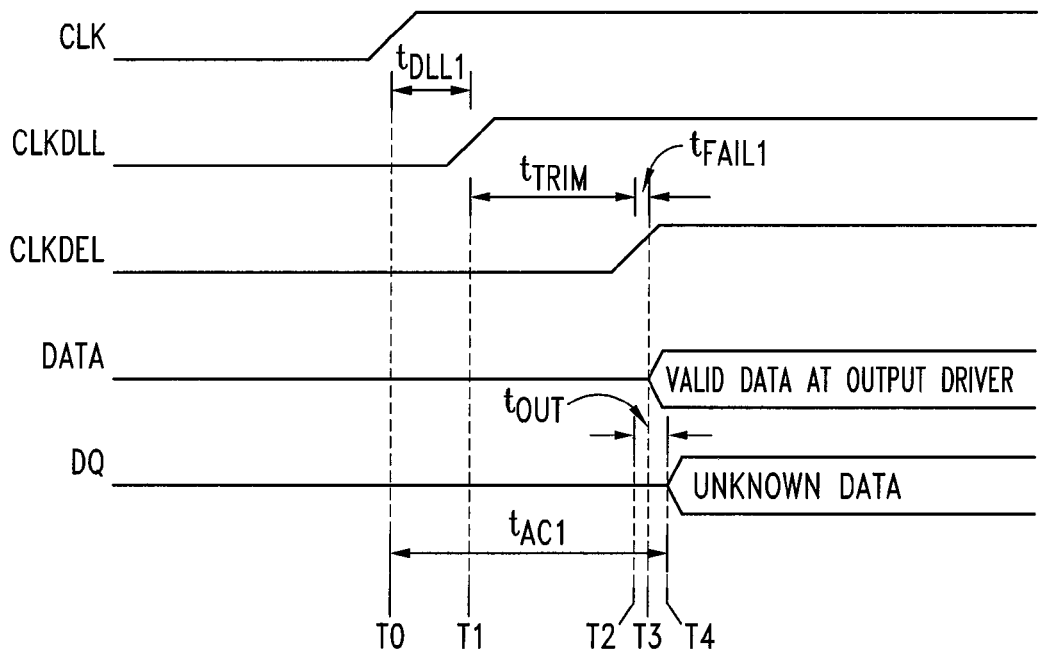
Figure 2C:
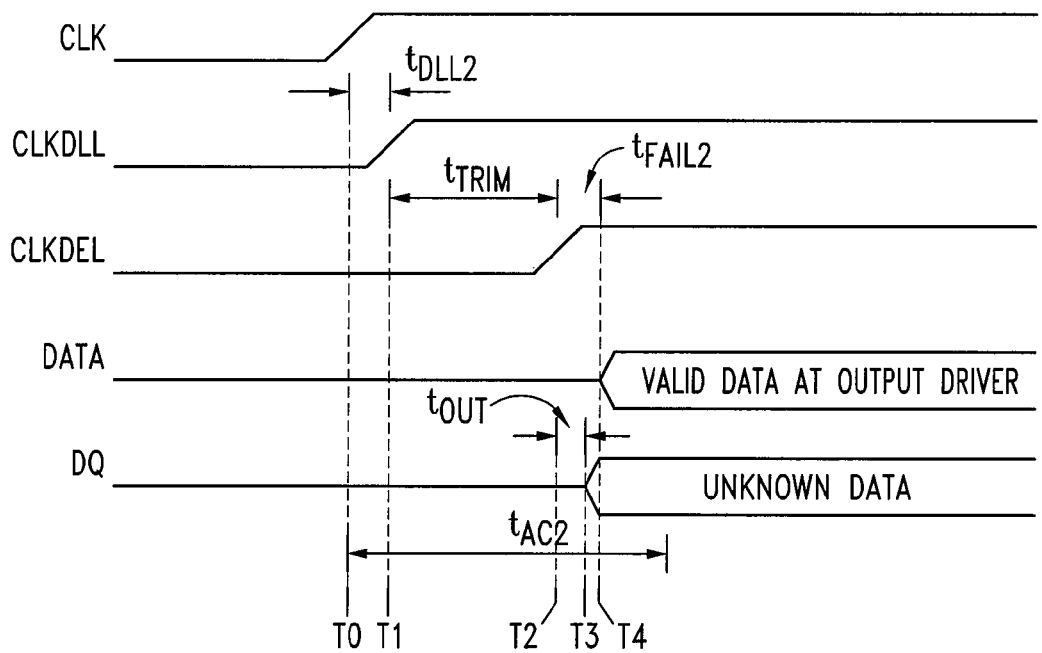
Figure 5A:
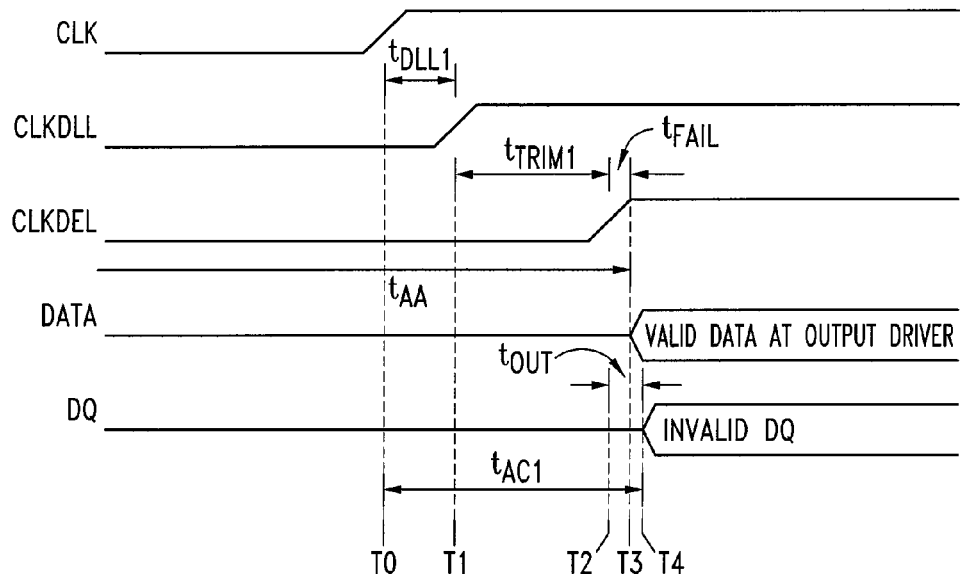
FIGS. 5A and 5B are signal timing diagrams illustrating various signals generated during operation of the delay clock generator of FIG. 4.
Figure 5B:
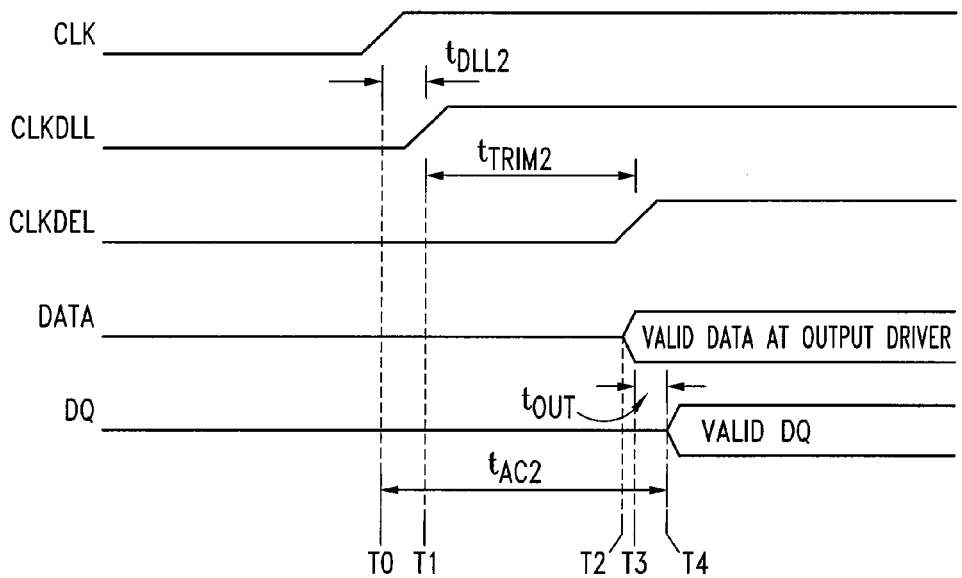

Advantages provided by the delay clock generator 400 will be explained with reference to FIGS. 5A and 5B. FIG. 5A is the same as the partial timing diagram of FIG. 2B, which shows the situation where tAA is too long to meet the published timing specifications for a first speed-grade. More specifically, the memory device fails to provide valid DQ signals within tAC 1 as a result of the tAA being too long. As previously discussed with respect to FIG. 2B, down-grading the speed-grade of the conventional memory device still does not result in an acceptable memory device although the tAC specification is relaxed at the lower speed-grade. The reason, as previously discussed, is that despite the longer tAC 2, the tAA is still unacceptably long. Moreover, because the time delay tDLL decreases for lower external clock frequencies due to the non-ideal characteristics of the DLL 106, and because the trimmable delay tTRIM is set for the worst case timing scenario, the time by which the memory device fails because of its tAA actually increases.

In contrast to the conventional memory devices, the delay clock generator 400 can adjust to provide greater internal timing margin through the use of the plurality of trimmable delays which can be selected based on the CAS latency value programmed in the mode register 335. FIG. 5B shows a timing diagram of various clock signals generated during the operation of the delay clock generator 400. FIG. 5B represents the timing of signals for a slower speed-grade, that is, having a lower maximum operation clock frequency and relaxed tAC specifications. At a time T0, the CLK signal transitions from LOW to HIGH. In response, at a time T1, the CLKDLL signal transitions from LOW to HIGH as well. Note that the time delay tDLL 2 is less than the time delay tDLL 1 of FIG. 5A because of the non-ideal nature of the DLL 106. At a time T3, that is, a time delay of tTRIM 2 after the CLKDLL signal makes its positive transition, the CLKDEL signal makes a transition from LOW to HIGH. Significantly, the time delay tTRIM 2 of FIG. 5B is longer than the time delay tTRIM 1 of FIG. 5A. Under the signal timing shown in FIG. 5A, a first CAS latency value activates a corresponding trimmable delay to provide the time delay tTRIM 1. However, under the signal timing shown in FIG. 5B, a second CAS latency value activates a second trimmable delay to provide the different time delay tTRIM 2. To the extent that the lower operating clock frequency of the slower speed-grade does not provide sufficient internal timing margin for the memory device to pass as an acceptable memory device, the additional time provided by the longer time delay of tTRIM 2 may provide sufficient timing margin for the memory device to pass.

As a result of the time delay tTRIM 2 being longer than the time delay tTRIM 1, by the time the CLKDEL signal makes its positive transition at the time T3, a valid DATA signal is already latched at the input of the output driver 102 at a previous time T2. Valid DQ signals will be provided by the output driver 102 at a time T4, which is a time tOUT after the CLKDEL signal transitions. As shown in FIG. 5B, the time T4 is within the tAC 2 specification. Thus, unlike the conventional memory device previously described, the memory device 400 meets the published timing specifications, and also has sufficient internal timing margin, as provided by the delay clock generator 400, to pass as an acceptable memory device for the slower speed-grade.

It will be appreciated that the design and operation of the functional blocks described herein can be conventional, and are well known to those ordinarily skilled in the art. Moreover, various modifications can be made to the specific embodiment described herein without departing from the scope of the present invention. For example, in one embodiment of the present invention, the number of trimmable delays included in the delay clock generator corresponds to the number of different latencies available for a memory device. Additionally, the trimming mechanism used for the trimmable delays can be through the use of antifuses, or alternatively, through the use of fuses trimmed or programmed according to conventional methods. Another example is modifying the trimmable delay structure of the delay clock generator such that instead of several parallel delay paths, one of which is selected for operation based on the CAS latency value, a series of delays can be trimmed and then selected time delay can be increased or decreased based on the CAS latency value. The scope of the present invention is not limited to the particular embodiments described herein.

Figure 6:
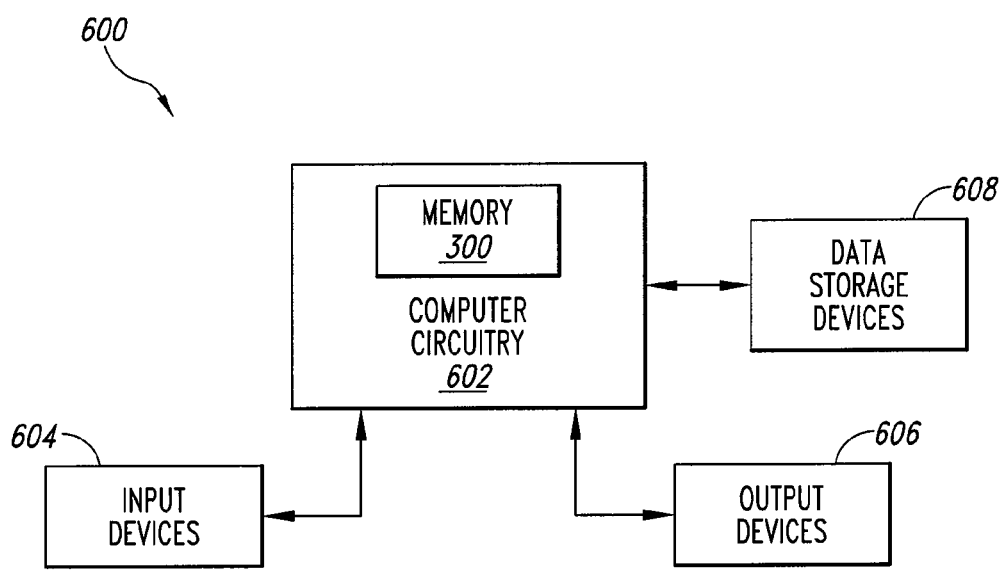
FIG. 6 is simplified functional block diagram of a processor-based system including the synchronous memory device of FIG. 3.

FIG. 6 is a block diagram of a processor-based system 600 including computer circuitry 602 including the memory device 300 of FIG. 3. Typically, the computer circuitry 602 is coupled through address, data, and control buses to the memory device 300 to provide for writing data to and reading data from the memory device. The computer circuitry 602 includes circuitry for performing various computing functions, such as executing specific software to perform specific calculations or tasks. In addition, the processor-based system 600 includes one or more input devices 604, such as a keyboard or a mouse, coupled to the computer circuitry 602 to allow an operator to interface with the computer system. Typically, the processor-based system 600 also includes one or more output devices 606 coupled to the computer circuitry 602, such as output devices typically including a printer and a video terminal. One or more data storage devices 608 are also typically coupled to the computer circuitry 602 to store data or retrieve data from external storage media (not shown). Examples of typical storage devices 608 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A computer system, comprising:
a data input device;
a data output device;
a processor coupled to the data input and output devices; and
a memory device coupled to the processor, the memory device, comprising:
an address bus;
a control bus;
an internal data bus;
an address decoder coupled to the address bus;
a control circuit coupled to the control bus; a memory-cell array coupled to the address decoder, control circuit; and
a read/write circuit coupled to the memory-cell array through the internal data bus to output data received from the memory-cell array, the read/write circuit including a synchronous data output circuit, comprising:
a synchronizing circuit having an input terminal at which an external clock signal is applied and having an output terminal at which an internal clock signal is provided; and
a delay circuit having an input coupled to the output of the synchronizing circuit, an output coupled to a clock terminal of an output driver, and a selection terminal for receiving a selection signal, the delay circuit configured to provide a clock signal to synchronize output by the output driver, the clock signal having a delay with respect to the internal clock signal according to one of a plurality of programmable time delay circuits having different time delays and selected in accordance with the selection signal.

2. The computer system of claim 1 wherein the memory device is a double data rate synchronous dynamic random access memory.

3. The computer system of claim 1 wherein the synchronizing circuit of the synchronous data output circuit comprises a delay-locked loop (DLL).

4. The computer system of claim 3 wherein the DLL comprises a DLL having a delay component that varies proportionately as a function of input clock frequency.

5. The computer system of claim 4 wherein the plurality of programmable time delay circuits comprise at least first and second time delay circuits having first and second time delays, respectively, the first time delay greater than the second time delay, the first time delay circuit activated for an input clock frequency less than a threshold frequency and the second time delay circuit activated for an input clock frequency greater than the threshold frequency.

6. The computer system of claim 1 wherein each of the plurality of programmable time delay circuits comprises a programmable delay element.

7. The computer system of claim 6 wherein each of the programmable delay elements comprise a delay element programmable by programming antifuses.

8. The computer system of claim 1 wherein the plurality of time delay circuits are further coupled to receive as the selection signal a signal indicative of a column address strobe latency value.

9. The computer system of claim 8 wherein the plurality of time delay circuits comprise a number of time delay circuits equal to the number of potential column address strobe latency values.

10. The computer system of claim 1 wherein the synchronous data output circuit further comprises a data strobe signal generator coupled to the output driver to generate a data strobe signal, the output driver further configured to output the data strobe signal in response to the clock signal applied to the clock terminal.

11. The computer system of claim 8 wherein the control circuit further comprises a mode register wherein the column address strobe latency value is programmed in the mode register.

12. A computer system, comprising:
a data input device;
a data output device;
a processor coupled to the data input and output devices; and
a memory device coupled to the processor, the memory device, comprising:
an address bus;
a control bus;
an internal data bus;
an address decoder coupled to the address bus;
a control circuit coupled to the control bus; a memory-cell array coupled to the address decoder, control circuit; and
a read/write circuit coupled to the memory-cell array through the internal data bus to output data received from the memory-cell array, the read/write circuit including a synchronous data output circuit, comprising:
a synchronizing circuit having an input terminal at which an external clock signal is applied and having an output terminal at which an internal clock signal is provided; and
a plurality of delay circuits, each having an input coupled to the output terminal of the synchronizing circuit, and having an activation terminal to which a selection signal is applied and further having an output terminal coupled to a clock terminal of the output driver, each of the plurality of delay circuits having a respective time delay and configured to generate a respective delayed output clock signal having the respective time delay relative to the internal clock signal when activated by the selection signal, one of the plurality of delay circuits activated by the selection signal to provide the respective delayed output clock signal as a clock signal to synchronize output of data by an output driver.

13. The computer system of claim 12 wherein the synchronizing circuit of the synchronous data output circuit comprises a delay-locked loop (DLL).

14. The computer system of claim 13 wherein the DLL comprises a DLL having a delay component that varies proportionately as a function of input clock frequency.

15. The computer system of claim 14 wherein the plurality of time delay elements comprise at least first and second time delay elements having first and second time delays, respectively, the first time delay greater than the second time delay, the first time delay element activated for an input clock frequency less than a threshold frequency and the second time delay element activated for an input clock frequency greater than the threshold frequency.

16. The computer system of claim 12 wherein each of the plurality of time delay elements comprises a programmable time delay element.

17. The computer system of claim 16 wherein each of the programmable time delay elements comprise a time delay element programmable by programming antifuses.

18. The computer system of claim 12 wherein the plurality of time delay elements are further coupled to receive as the selection signal a signal indicative of a column address strobe latency value.

19. The computer system of claim 18 wherein the plurality of time delay elements comprise a number of time delay elements equal to the number of potential column address strobe latency values.

* * * * *